United States Patent [19]
Lee

[11] Patent Number: 6,119,765
[45] Date of Patent: Sep. 19, 2000

[54] STRUCTURE OF HEAT DISSIPATING PIECES OF MEMORIES

[76] Inventor: Ming-Long Lee, No. 6, Lane75, Kang-Ning Rd. Sec.3, Nei-Hu, Taipei, Taiwan

[21] Appl. No.: 09/324,728

[22] Filed: Jun. 3, 1999

[51] Int. Cl.$^7$ ....................................................... H05K 7/20
[52] U.S. Cl. .......................... 165/80.3; 165/185; 391/704
[58] Field of Search .................................. 165/80.3, 185; 361/704, 710

[56] References Cited

U.S. PATENT DOCUMENTS

| | | | |
|---|---|---|---|
| 5,109,316 | 4/1992 | Funari et al. | 361/704 |
| 5,426,565 | 6/1995 | Anderson | 361/711 |
| 5,894,408 | 4/1999 | Stark et al. | 361/704 |
| 5,966,287 | 10/1999 | Lofland et al. | 361/704 |

*Primary Examiner*—Allen Flanigan
*Attorney, Agent, or Firm*—Jacobson, Price, Holman & Stern, PLLC

[57] ABSTRACT

An improved structure of heat dissipating components for memory including two components and two fixing nails. One of the components has a hook portion on the upper end. The upper end and center portion of the outer sides of the two components are arranged with a plurality of holes and a sawtooth shaped radiating surface. Two through holes are installed in proper positions at the lower end of each component. The fixing nails pass through the two through holes at the components, each fixing nail is enclosed by a spring and a flange is installed in the front end of the nail. A recess is installed in the center of the lower end of the nail. According to the aforementioned structure, during assembly, the hook portion of one piece will hook the upper end of another component. Then, two fixing nails are pressed into the through holes of the two components. The flange at the front end of the fixing nail will be buckled in the outer side of the component extruding from the through hole. When detaching, it is only necessary to use a tool to clamp the flange of the fixing nail. By the resilient force of the spring on the fixing nail, the fixing nail will be ejected. Furthermore, the sawtooth shaped radiating surface and the holes on the center portion and the upper end of the two components have a larger heat dissipating area. Thus the heat dissipation efficiency is increased.

1 Claim, 4 Drawing Sheets

STRUCTURE OF HEAT DISSIPATING PIECES OF MEMORIES

BACKGROUND OF THE INVENTION

1. Field of the Invention

The present invention relates to an improved structure of heat dissipating components for memory, and especially to a structure, wherein two components clamp memory chips, and by the sawtooth radiator and a small line of holes at outer sides of the two components, the heat dissipating efficiency is increased. Flanges at front ends of two fixing nails serve to tightly fix the fixing nails protruding from the two components.

2. Description of the Prior Art

The general heat dissipating structure for memory chips is formed by two components. The inner side and outer side of each component are adhered with a conductive piece and a heat dissipating piece, respectively, and then a plurality of screws serve to lock the two components so as to form an improved structure for memory chips. The conductive piece on the inner side transfers heat from the memory chips to the heat dissipating piece on the outer side. Thus, a heat dissipation effect is achieved.

Prior art heat dissipation devices for memory chips may attain adequate heat dissipation, but recent software requires more and more memory capacity. Therefore, general computers must have increased memory capacity. However, this will require a higher dissipation of heat. If the heat dissipation ability is poor, the stability of the computer will be affected.

SUMMARY OF THE INVENTION

Accordingly, the object of the present invention is to provide an improved heat dissipating structure for memory chips including two components and two fixing nails. One of the components has a bent portion on the upper end. The upper end and center portion of the outer sides of the two components are arranged with a plurality of holes and a sawtooth radiating surface. Two through holes are installed in proper positions at the lower end of each component. The fixing nails pass through the two through holes on the two components, each fixing nail is enclosed by a spring and a flange is installed in the front end of the nail. A recess is installed in the center of the lower end of the nail. According to the aforementioned structure, during assembly, the bent portion of one piece will hook the upper end of another component. Then, two fixing nails are pressed into the through holes of the two components. The flange at the front end of the fixing nail will be buckled in the outer side of the component extruding from the through hole. When detaching, it is only necessary to use a tool to clamp the flange of the fixing nail. By the resilient force of the spring on the fixing nail, the fixing nail will be ejected. Furthermore, the sawtooth shape radiating surface and the holes on the center portion and the upper end of the two components have a larger heat dissipating area. Thus, the heat dissipation efficiency is increased. Moreover, since the present invention has a simple structure, the product cost is reduced greatly.

Another object of the present invention is to provide an improved heat dissipating structure for memory chips having a sawtooth radiating surface and a line of holes. Therefore, the heat dissipation effect is increased. The bent portion of one component will hook the upper end of another component. Then, two fixing nails are pressed into the through holes of the two components.

The present invention will be better understood and its numerous objects and advantages will become apparent to those skilled in the art by referencing to the following drawings in which:

DETAILED DESCRIPTION OF THE PREFERRED EMBODIMENT

Figure 1:
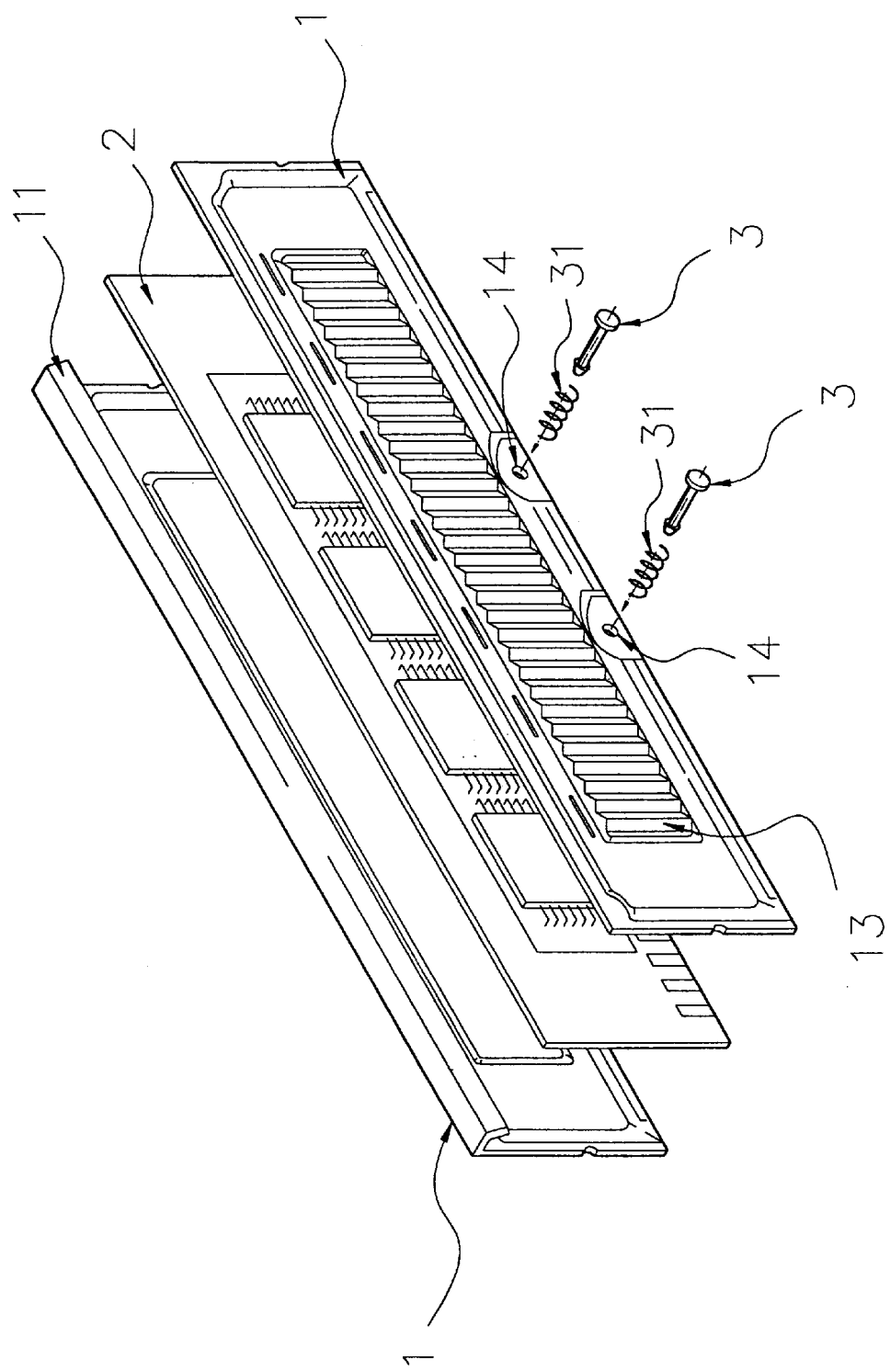
FIG. 1 is an enlarged perspective of the present invention.
Figure 2:
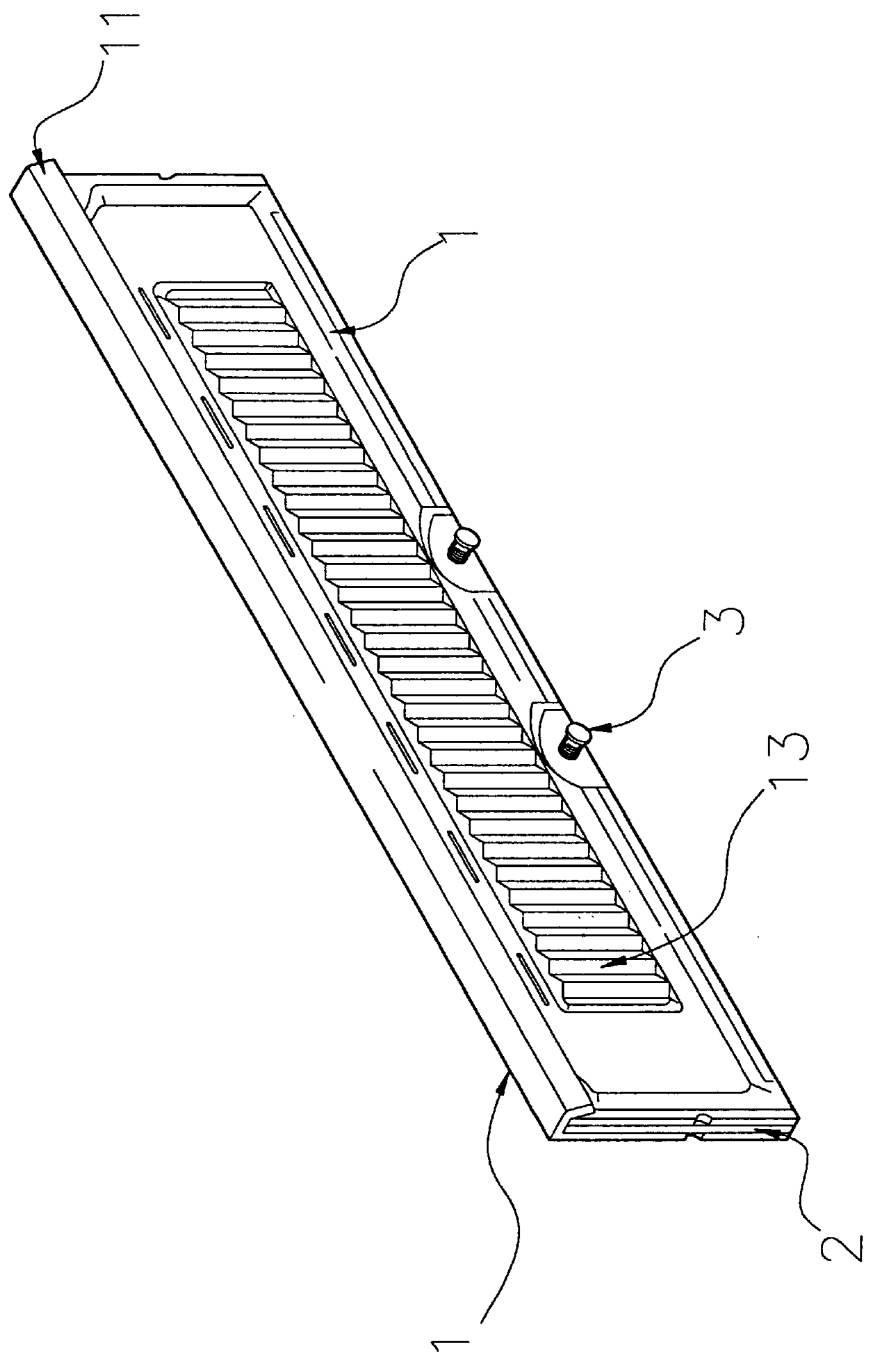
FIG. 2 is a perspective of the present invention.
Figure 3:
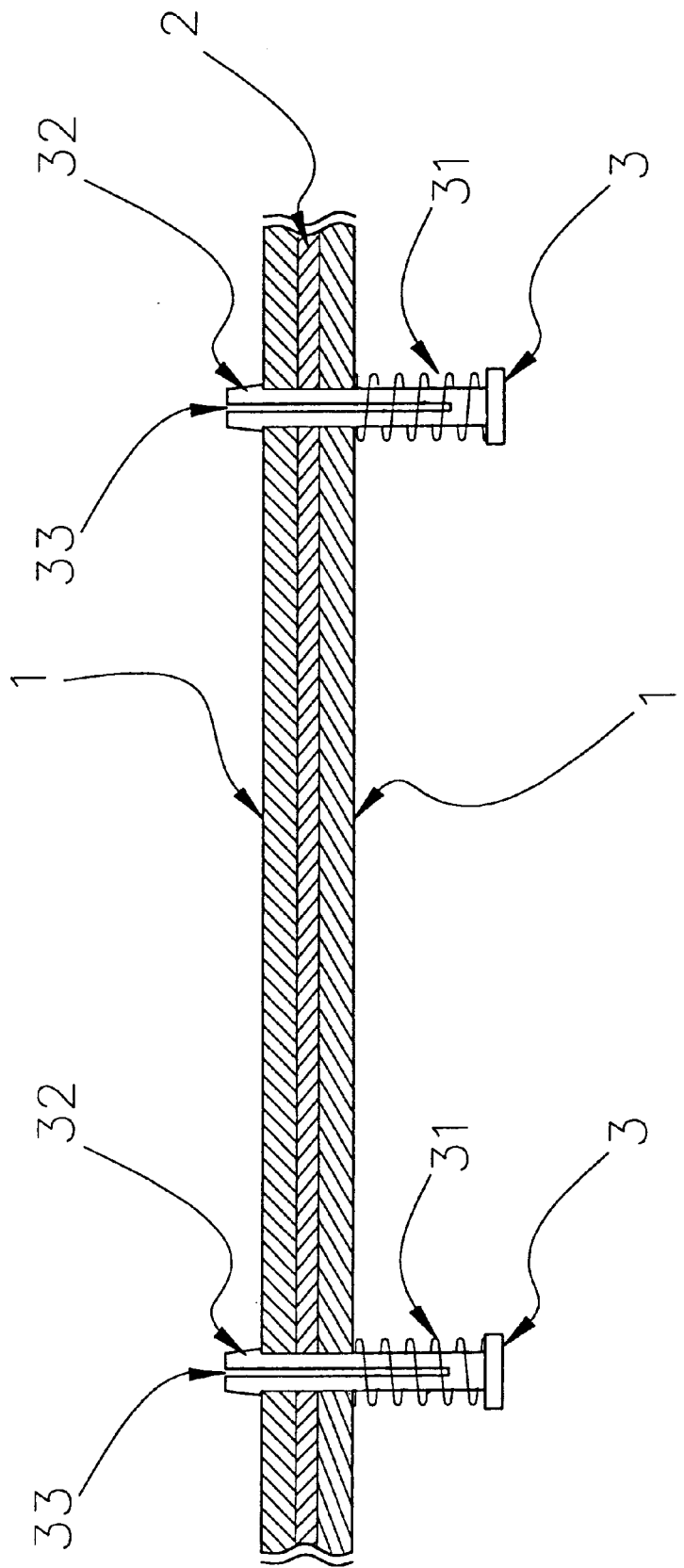
FIG. 3 is a cross sectional view of the present invention.
Figure 4:
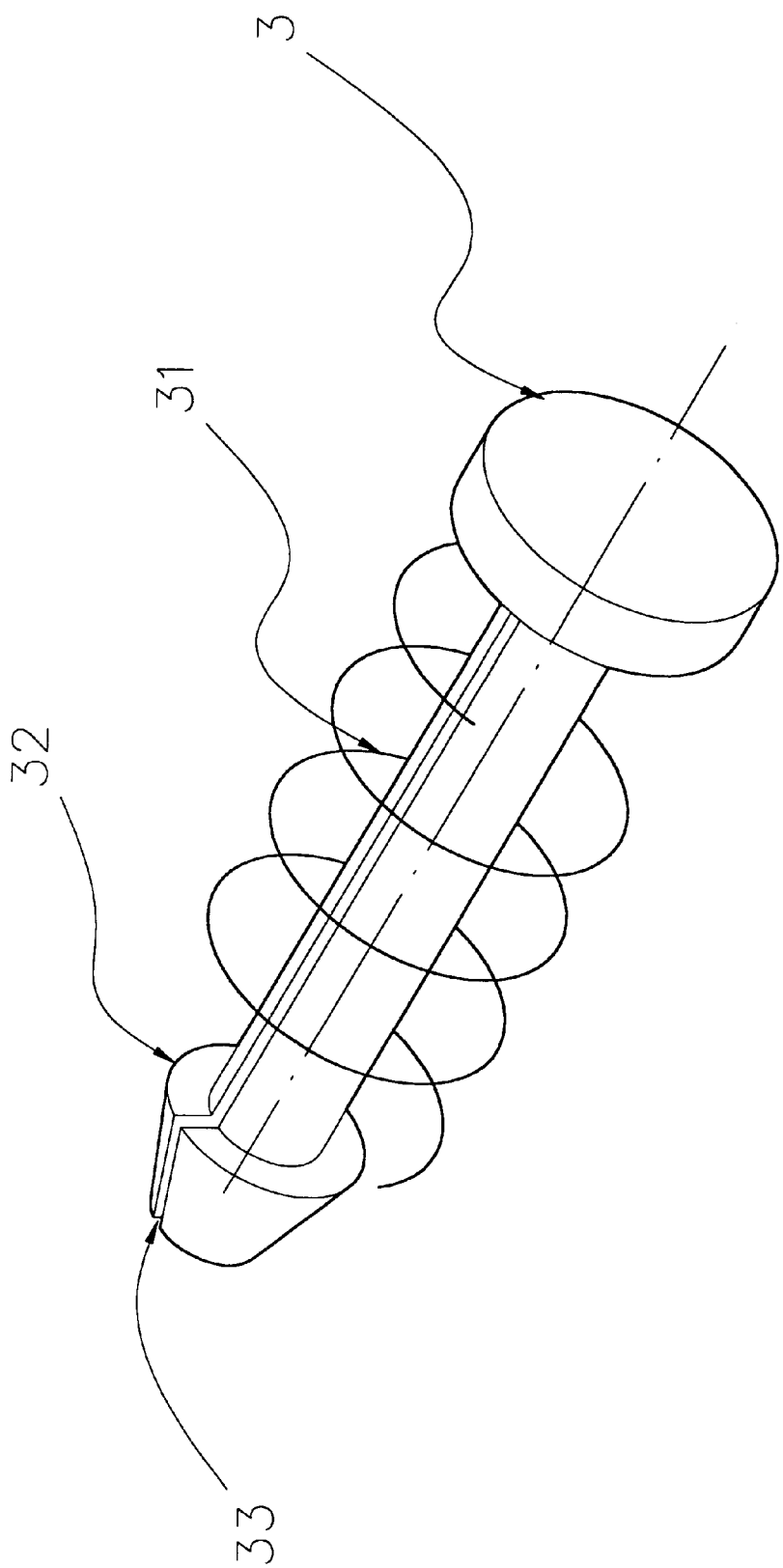
FIG. 4 is a perspective view showing the fixing nail of the present invention.

Referring to FIGS. 1,2 and 3, the present invention includes two components 1, and two fixing nails 3. The two components 2 clamp the left and right sides of the memory chip 2. One of the components 1 has a bent portion 11 on the upper end. The upper end and center portion of the outer sides of the two components 1 are arranged with a plurality of holes 12 and a sawtooth shape radiator 13. Two through holes 14 are installed on proper positions at the lower end of each component 1. The fixing nails 3 pass through the two through holes 14 at the two components 1. Each fixing nail 3 is enclosed by a spring 31 and a flange 32 is installed in the front end of the nail. Moreover, a recess 33 is installed in the center of the lower end of the nail. According to the aforementioned structure, during assembly, the bent portion 11 extends from the upper end of one component 1 will hook the upper end of another component 1. Then, two fixing nails 3 are pressed into the through holes 14 of the two components 1. The flange 32 at the front end of the fixing nail 3 will buckle to the outer side of the component 1 extruding from the through hole 14. Because of the elasticity of the compressible spring 31, the two components will be tightly engaged. In detaching, only a tool is needed to clamp the flange 33 of the fixing nail 3. By the resilient force of the spring 31 on the fixing nail 3, the fixing nail 3 will be ejected. Thus, the present invention can be easily-assembled and detached. Furthermore, the sawtooth shape radiating device 13 and the line of holes 14 on the center portion and the upper end of the two components 1 have a larger heat dissipating area. The line of holes 14 may serve to dissipate heat. Thus, the heat dissipation efficiency is increased. Furthermore, the present invention has a simple structure and can be assembled easily. Thus, it may be installed quickly and safely at a lower cost.

Although the present invention has been described using specified embodiment, the examples are meant to be illustrative and not restrictive. It is clear that many other variations would be possible without departing from the basic approach, demonstrated in the present invention.

What is claimed is:

1. An improved heat dissipating structure for memory chips comprising:

two relatively flat components each having a height and a length and where the first component has a bent portion at the top;

each component has a sawtooth shaped radiating surface located in its center portion at least on the outside surface;

each component has a plurality of holes including two holes at the bottom of each component which are aligned with each other and;

two spring biased fixing nails each having a flange at one end and a recess at the other end, wherein, the two components are adapted to be placed on either side of memory chips in a sandwich relationship and be held together by the fixing nails.

* * * * *